US008259189B2

(12) United States Patent
Sambongi

(10) Patent No.: US 8,259,189 B2
(45) Date of Patent: Sep. 4, 2012

(54) ELECTRONIC CAMERA

(75) Inventor: Sinsuke Sambongi, Wako (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 12/792,053

(22) Filed: Jun. 2, 2010

(65) Prior Publication Data

US 2010/0328479 A1 Dec. 30, 2010

(30) Foreign Application Priority Data

Jun. 4, 2009 (JP) ................................. 2009-134959

(51) Int. Cl.
*H04N 5/228* (2006.01)
*H04N 3/14* (2006.01)
*H04N 5/335* (2006.01)
*H04N 5/235* (2006.01)

(52) U.S. Cl. .................. 348/222.1; 348/294; 348/229.1

(58) Field of Classification Search ............... 348/222.1, 348/294, 302, 308, 229.1, 241; 250/208.1; 257/291–292

See application file for complete search history.

(56) References Cited

U.S. PATENT DOCUMENTS

| 4,779,137 A * | 10/1988 | Tojo et al. ................... 348/229.1 |
| 4,864,651 A * | 9/1989 | Ogiwara et al. .............. 398/202 |
| 2004/0145665 A1 * | 7/2004 | Oda et al. ....................... 348/257 |
| 2005/0068433 A1 * | 3/2005 | Aotsuka ......................... 348/272 |
| 2005/0099508 A1 * | 5/2005 | Oda et al. .................... 348/229.1 |
| 2007/0077053 A1 * | 4/2007 | Yanagi ........................... 396/166 |
| 2007/0223908 A1 * | 9/2007 | Sakamoto ...................... 396/234 |

FOREIGN PATENT DOCUMENTS

| JP | A-2000-316163 | 11/2000 |
| JP | A-2005-150886 | 6/2005 |
| JP | A-2007-306064 | 11/2007 |

OTHER PUBLICATIONS

Aug. 2, 2011 Office Action issued in Japanese Patent Application No. 2009-134959 (with translation).

\* cited by examiner

*Primary Examiner* — Nhan T Tran
*Assistant Examiner* — Tuan Le
(74) *Attorney, Agent, or Firm* — Oliff & Berridge, PLC

(57) ABSTRACT

An electronic camera includes an image sensor having a plurality of pixels and a control section that sets an imaging sensitivity at a time of imaging. Each of the pixels includes a first light receiving element that generates a first image signal, a second light receiving element that generates a second image signal higher in the sensitivity than the first image signal under a same condition, and an output circuit capable of adding the first image signal and the second image signal. The control section specifies an output signal of each of the pixels from the first image signal, the second image signal, and an additional image signal of the first image signal and the second image signal in accordance with an SN ratio at the imaging sensitivity.

3 Claims, 3 Drawing Sheets

ELECTRONIC CAMERA

CROSS REFERENCE TO RELATED APPLICATION

This application is based upon and claims the benefit of priority from Japanese Patent Application No. 2009-134959, filed on Jun. 4, 2009, the entire contents of which are incorporated herein by reference.

BACKGROUND

1. Field

The present application relates to an electronic camera.

2. Description of the Related Art

Conventionally, an electronic camera is publicly known, which applies an image sensor that generates image signals at different sensitivities with a set of light receiving elements for each pixel and captures an image in a wide dynamic range. Japanese Unexamined Patent Application Publication No. 2005-150886 discloses an electronic camera that performs processing to reduce noises based on two image signals at different sensitivities using an image sensor with the above-mentioned configuration.

However, the technique disclosed in Japanese Unexamined Patent Application Publication No. 2005-150886 premises that shooting is performed at an imaging sensitivity at which two image signals can be obtained for each pixel. Hence, for example, when shooting an image at a low imaging sensitivity, a light receiving element with a high sensitivity is saturated and it is difficult to obtain an image excellent in an SN ratio, and therefore, there is a room for improvement.

SUMMARY

An electronic camera in an aspect of embodiment includes an image sensor having a plurality of pixels and a control section that sets an imaging sensitivity at the time of imaging. Each of the pixels includes a first light receiving element that generates a first image signal, a second light receiving element that generates a second image signal higher in the sensitivity than the first image signal under the same condition, and an output circuit capable of adding the first image signal and the second image signal. The control section specifies an output signal of each of the pixels from the first image signal, the second image signal, and an additional image signal of the first image signal and the second image signal in accordance with an SN ratio at the imaging sensitivity.

In the aspect of embodiment, the control section may specify an image signal to the output signal, the image signal having the highest SN ratio of image signals that can be selected as the output signal at each of the imaging sensitivities. Further, the control section may specify the first image signal to the output signal when the imaging sensitivity is the lowest and change the output signal in a stepwise manner from the second image signal to the additional image signal in accordance with an increase in the imaging sensitivity.

DETAILED DESCRIPTION OF THE EMBODIMENT

Description of an Embodiment

Figure 1:
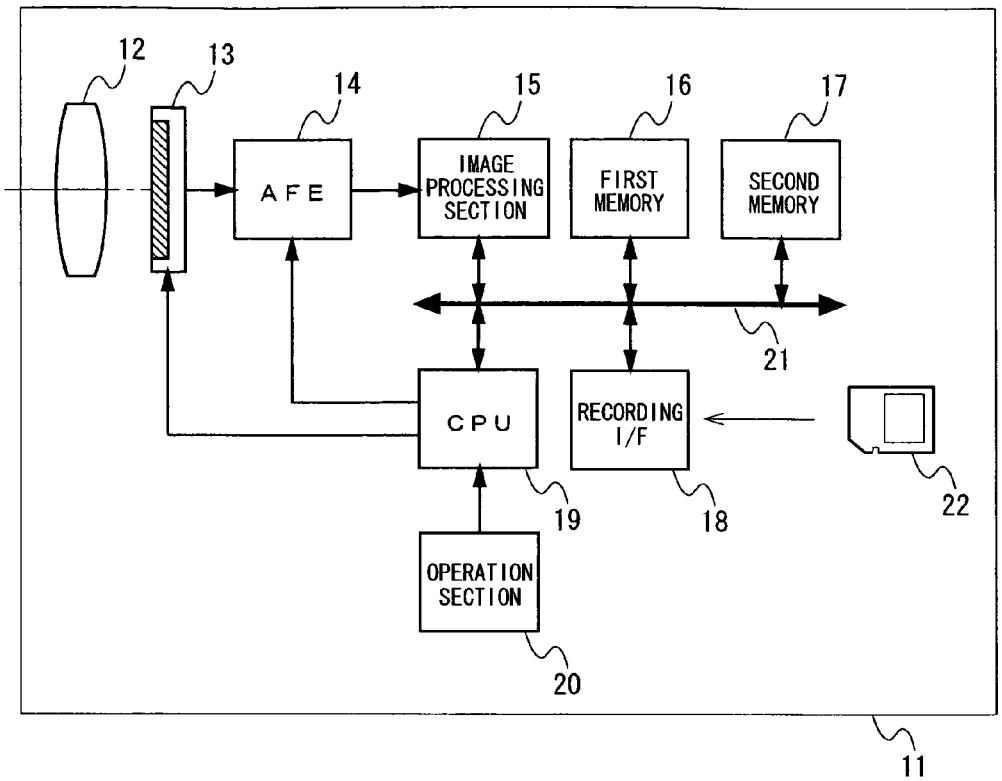
FIG. 1 is a block diagram showing a configuration example of an electronic camera in an embodiment.

FIG. 1 is a block diagram showing a configuration example of an electronic camera 11 in an embodiment. The electronic camera 11 includes an imaging lens 12, an image sensor 13, an AFE 14, an image processing section 15, a first memory 16, a second memory 17, a recording I/F 18, a CPU 19, an operation section 20, and a bus 21. Here, the image processing section 15, the first memory 16, the second memory 17, the recording I/F 18, and the CPU 19 are connected one another via the bus 21. Further, the image sensor 13, the AFE 14, and the operation section 20 are connected with the CPU 19, respectively.

The image sensor 13 is an imaging device that captures an image formed by the imaging lens 12. The image sensor 13 in the embodiment includes a CMOS type solid-state image sensor capable of reading an image signal of an arbitrary light receiving element by a random access. The output of the image sensor 13 is connected to the AFE 14.

On the light receiving surface of the image sensor 13, a plurality of pixels is arranged in a matrix. In each pixel of the image sensor 13, red (R), green (Gr, Gb), and blue (B) color filters are arranged in the publicly-known Bayer array.

Each pixel of the image sensor 13 has two light receiving elements, respectively; a first light receiving element PD1 and a second light receiving element PD2. Under the same condition, a first light receiving element PD1 generates an image signal (first image signal) with a relatively low sensitivity and a second light receiving element PD2 generates an image signal (second image signal) with a relatively high sensitivity. As an example, it is assumed that the sensitivity of the second light receiving element PD2 in the embodiment is set to sensitivity about four times that of the first light receiving element PD1.

Figure 2:
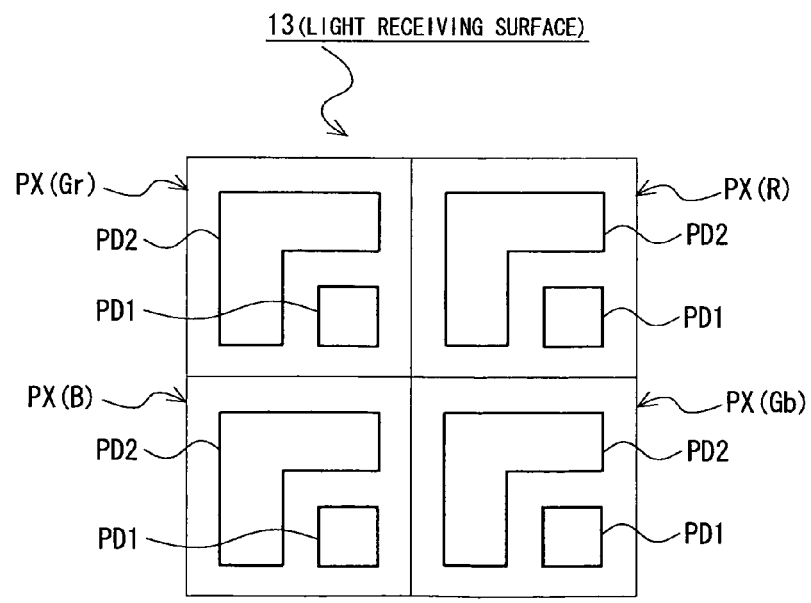
FIG. 2 is a diagram showing an example of a first light receiving element and a second light receiving element in an embodiment.

FIG. 2 is a diagram showing an example of the first light receiving element PD1 and the second light receiving element PD2 in the embodiment. In FIG. 2, 2×2 pixels (PX) are shown partially, however, it is obvious that a number of pixels are arranged on the light receiving surface of the actual image sensor 13.

In each pixel of the embodiment, the light receiving area of the second light receiving element PD2 is set larger than that of the first light receiving element PD1. Accordingly, under the same condition, the amount of light received per unit time is larger in the second light receiving element PD2 than in the first light receiving element PD1, and therefore, the second image signal has sensitivity relatively higher than that of the first image signal.

Figure 3:
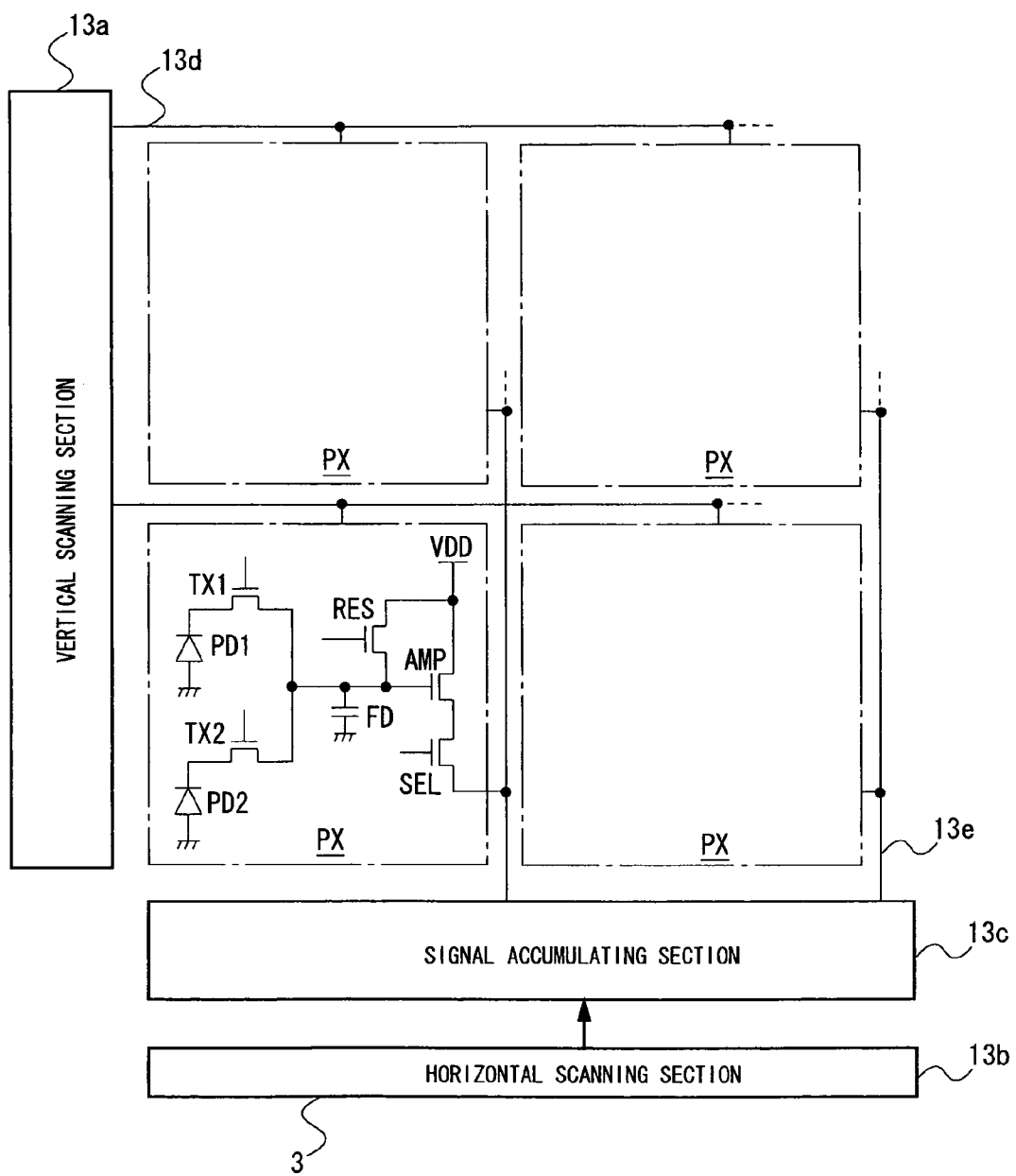
FIG. 3 is a diagram showing a circuit configuration example of an image sensor in an embodiment.

FIG. 3 is a diagram showing a circuit configuration example of the image sensor 13 in the embodiment. The image sensor 13 has a plurality of the pixels PX, a vertical scanning section 13a, a horizontal scanning section 13b, a signal accumulating section 13c, a plurality of scanning lines 13d extending in the horizontal direction, and a signal read line 13e provided for each column of the pixels PX.

To the vertical scanning section 13a, one end of each scanning line 13d is connected, respectively. The vertical scanning section 13a gives a pulse (selection pulse, reset pulse, transfer pulse, etc.) to specify a row to be read to each pixel from the scanning line 13d. The horizontal scanning section 13b outputs a pulse to specify a column to be read to the signal accumulating section 13c. To the signal accumulating section 13c, the lower end of the signal read line 13e is connected. The signal accumulating section 13c reads an image signal from each pixel via the signal read line 13e and at the same time, sequentially outputs read image signals to the AFE 14 in the later stage.

The pixel PX shown in FIG. 3 has the first light receiving element PD1, a transfer transistor TX1 connected to the first light receiving element PD1, the second light receiving element PD2, a transfer transistor TX 2 connected to the second light receiving element PD2, a floating diffusion FD, a reset transistor RES, an amplification transistor AMP, and a selection transistor SEL. In the example in FIG. 3, for the two sets of the light receiving element and the transfer transistor, the floating diffusion FD, the reset transistor RES, the amplification transistor AMP, and the selection transistor SEL are shared, respectively.

The first light receiving element PD1 and the second light receiving element PD2 generate signal charges in accordance with the amount of incident light, respectively. The transfer transistors TX1, TX2 transfer signal charges accumulated in the light receiving elements connected thereto, respectively, to the floating diffusion FD.

The reset transistor RES resets the floating diffusion FD to the power source voltage. The amplification transistor AMP outputs a read current to an output terminal via the selection transistor SEL in accordance with the voltage value of the floating diffusion FD. The selection transistor SEL connects the source of the amplification transistor AMP to the output terminal.

Here, it is possible for the image sensor 13 in the embodiment to read the first image signal or the second signal as an output signal of a pixel by causing either one of the transfer transistors TX1, TX2 to operate.

Further, it is also possible for the image sensor 13 in the embodiment to read the additional image signal of the first image signal and the second image signal as an output signal of a pixel. When adding and reading the first image signal and the second image signal, it may also be possible for the image sensor 13 to temporarily accumulate the signal charges of the first light receiving element PD1 and the second light receiving element PD2 in the floating diffusion FD and then output them.

In the following description, the operation mode of the image sensor 13 to cause each pixel to output the first image signal is referred to as a "first read mode". Further, the operation mode of the image sensor 13 to cause each pixel to output the second image signal is referred to as a "second read mode". Furthermore, the operation mode of the image sensor 13 to cause each pixel to output the additional image signal is referred to as an "additional read mode". The switching between each operation mode of the image sensor 13 is performed by the control of the CPU 19.

Returning to FIG. 1, the AFE 14 is an analog front end circuit that performs analog signal processing on the output of the image sensor 13. The AFE 14 performs correlation double sampling, adjustment of the gain of an image signal, and A/D conversion of an image signal. Then, the output of the AFE 14 is connected to the image processing section 15. The CPU 19 adjusts the imaging sensitivity corresponding to the ISO sensitivity by adjusting the gain of an image signal with the AFE 14.

The image processing section 15 performs various kinds of image processing (color interpolation processing, gradation conversion processing, white balance adjustment, etc.) on a digital image signal output from the AFE 14.

The first memory 16 temporarily stores data of an image in the pre-step or post-step of image processing. For example, the first memory 16 includes an SDRAM, which is a volatile storage medium. The second memory 17 is a nonvolatile memory that stores a program to be executed by the CPU 19 and a data table indicative of a correspondence relationship between the SN ratio and the imaging sensitivity value of each image signal (refer to FIG. 4).

The recording I/F 18 has a connector to connect a nonvolatile storage medium 22. Then, the recording I/F 18 writes/reads data of a main image, to be described later, to and from the storage medium 22 connected to the connector. The above-mentioned storage medium 22 includes a hard disc, a memory card that incorporates a semiconductor memory, etc. In FIG. 1, a memory card is shown schematically as an example of the storage medium 22.

The CPU 19 is a processor that totally controls the operation of the electronic camera 11. For example, the CPU 19 drives the image sensor 13 in accordance with an imaging instruction input by a user at the time of operation in the shooting mode to shoot an image of a subject and performs imaging processing of the main image accompanied by the recording to the nonvolatile storage medium 22.

The CPU 19 in the shooting mode performs the publicly-known automatic exposure operation prior to the imaging of the main image and sets an imaging sensitivity, which is one parameter of the imaging conditions. It may also be possible for the CPU 19 to set the above-mentioned imaging sensitivity based on an input of a user. Then, the CPU 19 in the shooting mode specifies the operation mode (first read mode, second read mode, and additional read mode) of the image sensor 13 in accordance with the above-mentioned imaging sensitivity value.

The operation section 20 has a plurality of switches to receive an operation of a user. The operation section 20 includes, for example, a release button to receive an imaging instruction of a main image, a cursor key in a cross shape, a decision button, etc.

Next, an operation example of the electronic camera 11 in the embodiment is explained. The CPU 19 in the shooting mode refers to the data table of the second memory 17 and changes the operation mode of the image sensor 13 in accordance with the imaging sensitivity value. At this time, the CPU 19 specifies the operation mode of the image sensor 13 so that the SN ratio of an image signal output from a pixel is the highest. Then, the image sensor 13 switches an image signal to output in the shooting mode to another in accordance with the operation mode specified by the CPU 19.

Here, the SN ratio of each image signal in the embodiment is explained. Noises of a light receiving element include a component of a light shot noise and a component of a base line noise (hereinafter, expressed as "B") that occurs in a read circuit in the dark. It is possible to find a light shot noise from the square root of the number of photons that enter the light receiving element.

Let the amount of charges generated per lux in the first light receiving element PD1 be "A[e/lx·s]" and the amount of charges generated per lux in the second light receiving element PD2 be "4A[e/lx·s]", and it is assumed that the base line noise B is sufficiently small as can be regarded as zero. Under those conditions, the SN ratio ($S_1/N_1$) of the first image signal can be found by the following expression (1). Similarly, the SN ration ($S_2/N_2$) of the second image signal by the following expression (2).

$$S_1/N_1 = \frac{A}{\sqrt{B^2 + \left(\sqrt{A}\right)^2}} \approx \sqrt{A} \quad (1)$$

$$S_2/N_2 = \frac{4A}{\sqrt{B^2 + \left(\sqrt{4A}\right)^2}} \approx \sqrt{4A} = 2\sqrt{A} \quad (2)$$

When the above-mentioned expressions (1), (2) are compared, the value of $S_2/N_2$ is larger than that of $S_1/N_1$. Consequently, it is known that an image signal acquired from a light receiving element with a relatively high sensitivity is more excellent in the SN ratio. If the first image signal and the second image signal are added, the amount of charges generated per unit time in the additional image signal is larger than that in the first image signal and that in the second image signal. Hence, under the same condition, the SN ratio is higher in the additional image signal than in the second image signal.

Figure 4:
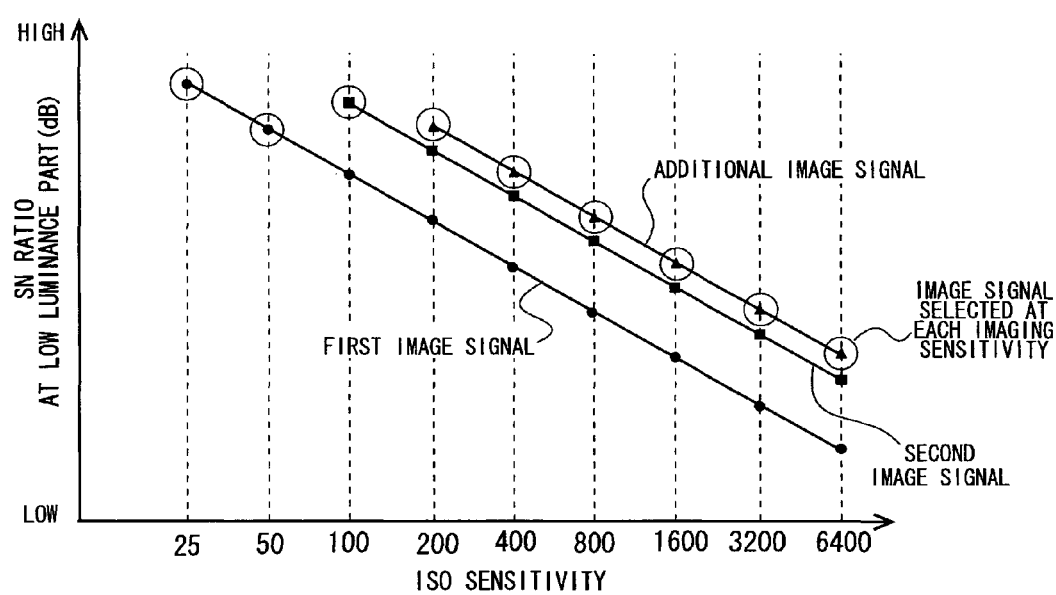
FIG. 4 is a schematic diagram showing a content of a data table in an embodiment.

FIG. 4 is a schematic diagram showing a content of a data table in the embodiment. The data table in FIG. 4 shows the SN ratio of each image signal (first image signal, second image signal, additional image signal) when acquiring a signal value for the same brightness (for example, 100 LSB in the gradation range of 12 bits) while varying the imaging sensitivity (ISO sensitivity) value.

Consequently, in FIG. 4, as the imaging sensitivity value increases, the charge accumulation time when shooting an image is reduced. Further, when the imaging sensitivity is increased for image signals of the same kind, the charge accumulation time is reduced, the signal component is reduced, and the influence of the base line noise becomes larger relatively. As a result of this, in FIG. 4, when the imaging sensitivity is increased even for image signals of the same kind, the SN ratio is reduced accordingly.

When the imaging sensitivity value is reduced, the charge accumulation time when shooting an image is increased, and therefore, the higher the imaging sensitivity of the light receiving element of the image sensor 13 becomes, the more likely an overexposure is to occur because the saturation occurs at a lower imaging sensitivity. Consequently, in FIG. 4, in a range where the ISO sensitivity is less than 100, there is no value of the second image signal and the specification of the second read mode is disabled in the range. Similarly, in FIG. 4, in a range where the ISO sensitivity is less than 200, there is no value of the additional image signal and the specification of the additional read mode is disabled in the range.

The CPU 19 in the shooting mode refers to the data table in FIG. 4 and specifies the first read mode as the operation mode of the image sensor 13 when the ISO sensitivity is the lowest. Then, the CPU 19 changes the operation mode of the image sensor 13 in a stepwise manner from the second read mode to the additional read mode in accordance with an increase in the ISO sensitivity.

That is, when the imaging sensitivity value is ISO 25 or ISO 50, in the data table, only the first image signal can be selected as an output signal. Hence, the CPU 19 specifies the first read mode corresponding to the first image signal as the operation mode of the image sensor 13.

When the imaging sensitivity value is ISO 100, in the data table, the first image signal and the second image signal can be selected as an output signal. Hence, the CPU 19 specifies the second read mode corresponding to the second image signal with a higher SN ratio of the two kinds of image signal as the operation mode of the image sensor 13.

When the imaging sensitivity value is ISO 200 or more, in the data table, the first image signal, the second image signal, and the additional image signal can be selected as an output signal. Hence, the CPU 19 specifies the additional read mode corresponding to the additional image signal with the highest SN ratio of the three kinds of image signal as the operation mode of the image sensor 13.

According to the electronic camera 11 in the above-mentioned embodiment, it is possible to acquire an image even with a lower imaging sensitivity by performing shooting using the first light receiving element PD1 with a relatively low sensitivity. With the electronic camera 11 in the embodiment, shooting is performed using an image signal with an excellent SN ratio in accordance with the setting of the imaging sensitivity, and therefore, it is possible to acquire an image with an excellent SN ratio-respectively in a wide imaging sensitivity range.

Modified Example of the Embodiment

In the above-mentioned embodiment, the configuration is such that the difference in sensitivity is produced by the difference in the light receiving area between the first light receiving element PD1 and the second light receiving element PD2, however, the first light receiving element and the second light receiving element of the present invention are not limited to those in the above-mentioned configuration.

For example, it may also be possible to produce the difference in sensitivity between the two light receiving elements by arranging microlenses with different light condensing rates on the first light receiving element and the second light receiving element, respectively. In this case, the same effect as that in the embodiment is exhibited and at the same time, it is also made possible to manufacture the first light receiving element and the second light receiving element in the same semiconductor process.

Further, it may also be possible to produce the difference in sensitivity between the two light receiving elements by arranging color filters of the same color having different transmittances of light on the first light receiving element and the second light receiving element, respectively. In this case also, the same effect as that in the embodiment is exhibited and at the same time, it is also made possible to manufacture the first light receiving element and the second light receiving element in the same semiconductor process.

Furthermore, it may also be possible to configure the first light receiving element and the second light receiving element by arranging two light receiving elements with different photoelectric conversion efficiencies in one pixel. In this case also, the same effect as that in the embodiment can be exhibited.

The configuration of the first light receiving element and the second light receiving element of the present invention may be, of course, realized by a combination of two or more techniques disclosed in the above-mentioned embodiment and the modified example of the embodiment.

An output of an image sensor using one kind of light receiving element is, in general, in a relationship in which when the ISO sensitivity increases, the SN ratio of an image signal decreases. On the other hand, in the above-mentioned embodiment, there is a case where the SN ratio increases even when the ISO sensitivity is increased (for example, when the ISO sensitivity is changed from 50 to 100 in FIG. 4) or a case where the SN ratio decreases when the ISO sensitivity is reduced (for example, when the ISO sensitivity is changed from 100 to 50 in FIG. 4). Because of this, with the configuration in the above-mentioned embodiment, there is a possibility that some users may feel uncomfortable about the relationship between ISO sensitivity and SN ration.

Therefore, it may also be possible for the CPU 19 to limit the selection of the ISO sensitivity in the above-mentioned embodiment in order to prevent a user from feeling uncomfortable about the relationship between ISO sensitivity and SN ratio.

Specifically, it may also be possible for the CPU 19 to make settings so that the ISO sensitivity cannot be selected automatically or manually when the SN ratio of a pixel signal with the largest SN ratio at a certain ISO sensitivity is smaller than both the SN ratios of pixel signals with the largest SN ratio at ISO sensitivities before and after the certain ISO sensitivity.

For example, in the above-mentioned embodiment, it is recommended for the CPU 19 to prevent a user or a camera from selecting the setting of ISO 50 because the SN ratio at ISO 50 is smaller than both the SN ratios at ISO 25 and ISO 100 (refer to FIG. 4). With such a configuration, it is possible to prevent a user from feeling uncomfortable about the relationship between ISO sensitivity and SN ratio when operating the electronic camera 11.

The many features and advantages of the embodiments are apparent from the detailed specification and, thus, it is intended by the appended claimed to cover all such features and advantages of the embodiments that fall within the true spirit and scope thereof. Further, since numerous modifications and changes will readily occur to those skilled in the art, it is not desired to limit the inventive embodiments to the exact construction and operation illustrated and described, and accordingly all suitable modifications and equivalents may be resorted to, falling within the scope thereof.

What is claimed is:

1. An electronic camera comprising:
an image sensor having a plurality of pixels; and
a control section configured to set, at a time of imaging, a selected imaging sensitivity from a plurality of imaging sensitivities, wherein
each of the pixels includes:
  a first light receiving element configured to generate a first image signal;
  a second light receiving element configured to generate a second image signal higher in imaging sensitivity than the first image signal under a same condition; and
  an output circuit configured to add the first image signal and the second image signal, and wherein
the control section is configured to specify an output signal of each of the pixels from one of the first image signal, the second image signal, and an additional image signal of the first image signal and the second image signal in accordance with an SN ratio at the selected imaging sensitivity, and when the selected imaging sensitivity is lowest of the plurality of imaging sensitivities, the control section is further configured to specify only the first image signal as the output signal.

2. The electronic camera according to claim 1, wherein the control section is configured to specify an image signal as the output signal, the specified image signal having a highest SN ratio of image signals that can be selected as the output signal at the selected imaging sensitivity.

3. The electronic camera according to claim 2, wherein the control section changes the output signal in a stepwise manner from the second image signal to the additional image signal in accordance with an increase in the selected imaging sensitivity.

* * * * *